United States Patent
Cui et al.

(10) Patent No.: US 6,635,144 B2
(45) Date of Patent: Oct. 21, 2003

(54) APPARATUS AND METHOD FOR DETECTING AN END POINT OF CHAMBER CLEANING IN SEMICONDUCTOR EQUIPMENT

(75) Inventors: Zhenjiang Cui, Santa Clara, CA (US); Padmanabhan Krishnaraj, San Francisco, CA (US); Shamouil Shamouilian, San Jose, CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 09/833,437

(22) Filed: Apr. 11, 2001

(65) Prior Publication Data

US 2002/0151186 A1 Oct. 17, 2002

(51) Int. Cl.[7] ................................................. B08B 6/00
(52) U.S. Cl. ............................ 156/345.25; 156/345.24; 156/345.26; 156/345.27; 156/345.43; 156/345.47
(58) Field of Search ...................... 156/345.27, 345.25, 156/345.24, 345.26; 134/1.1

(56) References Cited

U.S. PATENT DOCUMENTS

| | | | |
|---|---|---|---|
| 5,016,663 A | 5/1991 | Mase et al. ..................... 134/1 |
| 5,200,023 A * | 4/1993 | Gifford et al. ................ 216/59 |
| 5,779,925 A * | 7/1998 | Hashimoto et al. ........... 216/67 |
| 6,060,397 A | 5/2000 | Seamons et al. ............. 438/694 |
| 6,112,431 A | 9/2000 | Kato et al. ..................... 34/406 |
| 6,232,236 B1 * | 5/2001 | Shan et al. ................. 438/715 |
| 6,468,384 B1 * | 10/2002 | Singh et al. ........... 156/345.27 |

* cited by examiner

*Primary Examiner*—Jeffrie R. Lund
(74) *Attorney, Agent, or Firm*—Birgit Morris; Joseph Bach

(57) ABSTRACT

Apparatus for processing semiconductor wafers includes a processing chamber, a chuck within the chamber for supporting a wafer during processing, a fiberoptic cable having a first end positioned at the surface of the chuck, and an optical pyrometer connected to a second end of the cable. The optical pyrometer measures the temperature of a wafer during processing and measures in situ temperature of plasma-excited cleaning gas introduced into the chamber during subsequent cleaning from walls thereof of unwanted solid deposits within the chamber. The pyrometer is connected to a computer which controls the flow of cleaning gases. When the temperature of the plasma-excited gas reaches a steady-state value the computer stops the flow of cleaning gases into the chamber and thereby stops the cleaning operation.

8 Claims, 1 Drawing Sheet

APPARATUS AND METHOD FOR DETECTING AN END POINT OF CHAMBER CLEANING IN SEMICONDUCTOR EQUIPMENT

FIELD OF THE INVENTION

This invention relates to apparatus and a method for detecting of the completion or end point of a cleaning process for a chamber used in semiconductor processing.

BACKGROUND OF THE INVENTION

In the manufacturing of semiconductor devices, such as integrated circuits, memories, etc., a semiconductor wafer (e.g., a thin disc of single-crystal silicon) is sequentially put through a number of processing steps. Typically one or more of these steps involves exposing the wafer to a mixture of reactive gasses to deposit thin layers of insulation, such as silicon dioxide ($SiO_2$), on exposed surfaces of the wafer. The reactive gasses comprise, for example, ozone or oxygen on the one hand and an organic vapor of a liquid, such as tetraethylorthosilicate (TEOS), in an inert gas such as helium on the other hand.

During such deposition of an insulation layer, a wafer typically sits on a chuck in a sealed processing chamber while a thin film of solid material (e.g., $SiO_2$) is formed on an exposed surface of the wafer. However, the gaseous compound within the chamber from which the thin film is being formed on the wafer likewise, though undesirably, deposits solid material (e.g., $SiO_2$) on inside walls of the chamber and on other exposed surfaces within it. Such undesirable deposits, if allowed to accumulate, produce dust and particles which can contaminate subsequent wafers when they afterward are processed in the chamber. It is necessary therefore to periodically clean the chamber of such deposits.

In the past various ways of cleaning processing chambers have been employed in the semiconductor industry. One way of cleaning, termed wet-cleaning, is to open a chamber and to manually wipe down its inside wall and surfaces. This involves a considerable loss of production time of the equipment, and requires expensive hand labor. Another way of cleaning a chamber, termed dry cleaning, is to employ a plasma-excited cleaning gas, such as fluorine, $NF_3$, $C_xF_y$, or $SF_6$, to chemically etch away the unwanted solid deposits inside the chamber. With previous systems it has been difficult to tell when the dry cleaning operation has been completed. As a result, the cleaning process is often continued considerably beyond the point at which the chamber is clean. Thus, additional time is used which limits throughput and increases the danger of unwanted etching of the chamber walls by unnecessarily prolonging the cleaning process to be sure that solid deposits have been all cleaned away. It is desirable to have a more efficient and cost-effective way of detecting an end point of cleaning.

SUMMARY OF THE INVENTION

In one aspect, the present invention includes apparatus which comprises a semiconductor processing chamber, an optical temperature sensor located within the chamber, and a controller. The semiconductor processing chamber has electrical elements which help facilitate a plasma in the chamber from cleaning gases introduced into the chamber. The controller has an input coupled to an output of the optical temperature sensor and is adapted to control a flow of cleaning gases into the chamber such that during a cleaning operation of the chamber the flow of cleaning gases is cutoff when the plasma temperature reaches a value indicative of completion of cleaning.

In another aspect, the present invention includes apparatus for processing semiconductor wafers. The apparatus comprises a processing chamber, a support member within the chamber having a surface capable of supporting a wafer during processing, a fiberoptic cable having a first end positioned near the surface of the support member, an optical pyrometer, and a computer. The optical pyrometer is connected to a second end of the cable and measures the temperature of a wafer during processing and for thereafter measures in situ temperature of plasma-excited cleaning gas in the chamber during subsequent cleaning away of unwanted solid deposits within the chamber. The computer is coupled to the pyrometer for determining how soon after cleaning is started the temperature of the plasma-excited gas reaches a value indicative of a cleaning end point and for thereupon stopping the cleaning operation.

In a further aspect, the present invention includes apparatus for chemical vapor deposition (CVD) of materials onto semiconductor wafers. The apparatus comprises a processing chamber, a chuck within the chamber and having a surface for supporting a wafer during CVD processing, a fiberoptic cable having a first end positioned at the surface of the chuck, an optical pyrometer, a gas supply, electrodes, a gas outlet, and a computer. The optical pyrometer is connected to a second end of the cable for measuring temperature of a wafer during processing and for thereafter measuring in situ temperature of plasma-excited cleaning gas in the chamber during subsequent cleaning away of unwanted solid deposits within the chamber. The gas supply admits cleaning gas into the chamber. The electrodes generate a plasma-discharge in the cleaning gas. The gas outlet exhausts cleaning and other gases downward from the chuck and out of within the chamber. The computer is coupled to the pyrometer for determining how soon after cleaning is started the temperature of the plasma-excited gas reaches a value indicative of an end point of cleaning. The computer controls the gas supply, the electrodes, and the gas outlet to stop the cleaning operation when the end point value temperature is detected.

From a first method aspect, the present invention includes a method of cleaning a semiconductor chamber of undesirable deposits. The method comprises the steps of: flowing cleaning gases into the chamber; generating a plasma from the cleaning gases; optically measuring the temperature within the chamber as the cleaning gases flow into the chamber; and terminating the flow of cleaning gases into the chamber when the temperature within the chamber reaches a value indicative of completion of cleaning.

In an additional aspects the present invention includes a method for cleaning a semiconductor processing chamber of solid material deposited thereon during chemical vapor deposition (CVD) of a layer of material on to a wafer processed in the chamber. The method comprising the steps of: flowing cleaning gas into the chamber; establishing a plasma-discharge in the cleaning gas; measuring via a fiberoptic cable and an optical pyrometer the in situ temperature of the plasma-excited cleaning gas as it removes deposits of solid material left in the chamber from previous CVD processing of a wafer; monitoring the change in temperature versus time of the plasma-excited cleaning gas to determine when the temperature reaches a value indicative of a cleaning end point; and terminating the cleaning process when the temperature reaches the cleaning end point value.

From an additional aspect, the present invention includes method of chemical vapor deposition (CVD) of solid material onto a semiconductor wafer and for then cleaning the chamber of unwanted solid residues left in the chamber after such processing. The method comprises the steps of: depositing solid material on a wafer by CVD processing in the chamber; measuring temperature from one side of the wafer during processing the temperature thereof using a fiberoptic cable and optical pyrometer; removing the wafer from the chamber; admitting cleaning gas into the chamber to remove unwanted deposits of solid material left after the CVD processing; plasma-exciting the cleaning gas; using the fiberoptic cable and pyrometer to measure in situ the temperature of the cleaning gas as it cleans away unwanted solid deposits; monitoring the temperature versus time of the plasma-excited cleaning gas to determine an end point of cleaning as indicated by temperature of the plasma-excited gas rising from an initial value to a steady-state value; evacuating cleaning gas mixed with gassified portions of the solid material to maintain a desired pressure in the chamber; and terminating the cleaning process when the steady-state temperature is reached.

A better understanding of the invention will best be gained from the following description given in conjunction with the accompanying drawings and claims.

DETAILED DESCRIPTION

Figure 1:
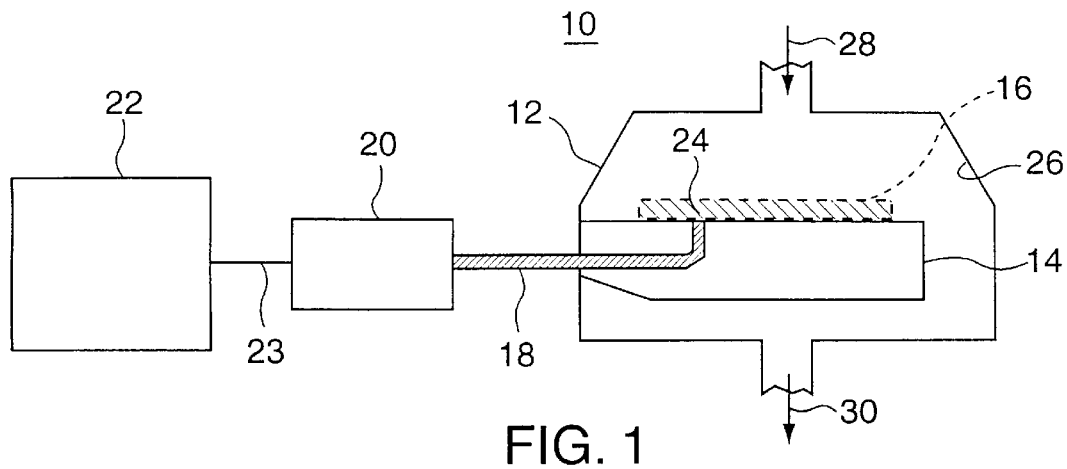
FIG. 1 is a schematic representation of semiconductor processing apparatus in accordance with the present invention.

Referring now to FIG. 1, there is shown in schematic form, with parts broken away and other parts not shown, a semiconductor wafer processing apparatus 10 in accordance with the present invention. The apparatus 10 comprises a sealed processing chamber 12, a wafer-holding chuck (support member) 14 adapted to support a semiconductor wafer 16, a fiberoptic cable 18, an optical pyrometer 20, and a computer (controller, microprocessor) 22 coupled to the pyrometer by a lead 23. The computer is also coupled to other parts of the apparatus by means not shown. The wafer 16 is shown in dashed outline to indicate that the previous processing step has been completed and that the chamber 12 is in condition for cleaning. While the wafer 16 was being processed, such as by having a thin layer of dielectric material such as $SiO_2$ deposited on its exposed surface by chemical vapor deposition (CVD), the wafer 16 rested on the chuck 14 (which may for example be an electrostatic chuck). In this position the wafer 16 covers an end 24 of the fiberoptic cable 18 which is flush with the surface of the chuck 14. Signals sent by the fiberoptic cable 18 to the pyrometer 20 are used to measure the temperature of the wafer 16 during deposition of an insulating layer. In the course of such layer deposition, unwanted solid material (e.g., $SiO_2$) is also deposited along an inside wall 26, and on other surfaces within the chamber 12. This unwanted material, as was explained previously, should be cleaned away to prevent contamination of a subsequent wafer being processed.

After the wafer 16 is removed from the chamber 12 (as indicated here by the wafer 16 being shown in dashed outline), the chamber is ready for cleaning. Cleaning is commenced by the computer 22 admitting cleaning gas (e.g., a mixture of fluorine, $NF_3$, and other gases well known in the art) into the chamber 12 as indicated by an arrow 28. This gas is plasma-excited, as is well known, by electrical elements such as electrodes or coils (not shown), which are powered electrically on command from the computer 22, and the thus activated gas etches away the unwanted deposits of solid material remaining within the chamber 12 (a process well known in the art). Gas is exhausted, also on command from the computer 22, from the bottom of the chamber 12 at a rate which maintains a desired pressure (e.g. sub-atmospheric) within the chamber 22.

While the cleaning process is being carried out, cleaning gas is being admitted typically at the top or side of the chamber 12 (arrow 28), and cleaning gas mixed with gassified portions of solid residues being cleaned out of the chamber 12 are exhausted downward from the chamber 12 as indicated by an arrow 30. During this cleaning process, the end 24 of the fiberoptic cable 18 is uncovered, the wafer 16 having been previously removed, and the pyrometer 20 is able now to measure directly, in situ, the temperature of the plasma-excited gas in the chamber 12. As a result of this in situ arrangement, temperature of the gas is measured with greater accuracy than if it were measured indirectly, or by other means. The computer 22, in accordance with the invention, makes a continuing record of temperature of the plasma-excited gas measured by the pyrometer 20 as a function of time. When the end point of cleaning is reached (i.e., all undesired deposits on the inside of the chamber 22 are removed), the temperature of the plasma-excited gases reaches a steady-state value (level plateau). Then the computer 22 automatically stops the cleaning process by cutting power to the plasma-exciting electrodes (not shown), stopping the inflow of cleaning gas, and then purging the chamber 12 by, for example, introducing inert gas at suitable pressure. An example of temperature measurements made by the pyrometer 20 and their indication of the end point of cleaning of the chamber 12 is shown in FIG. 2.

Figure 2:
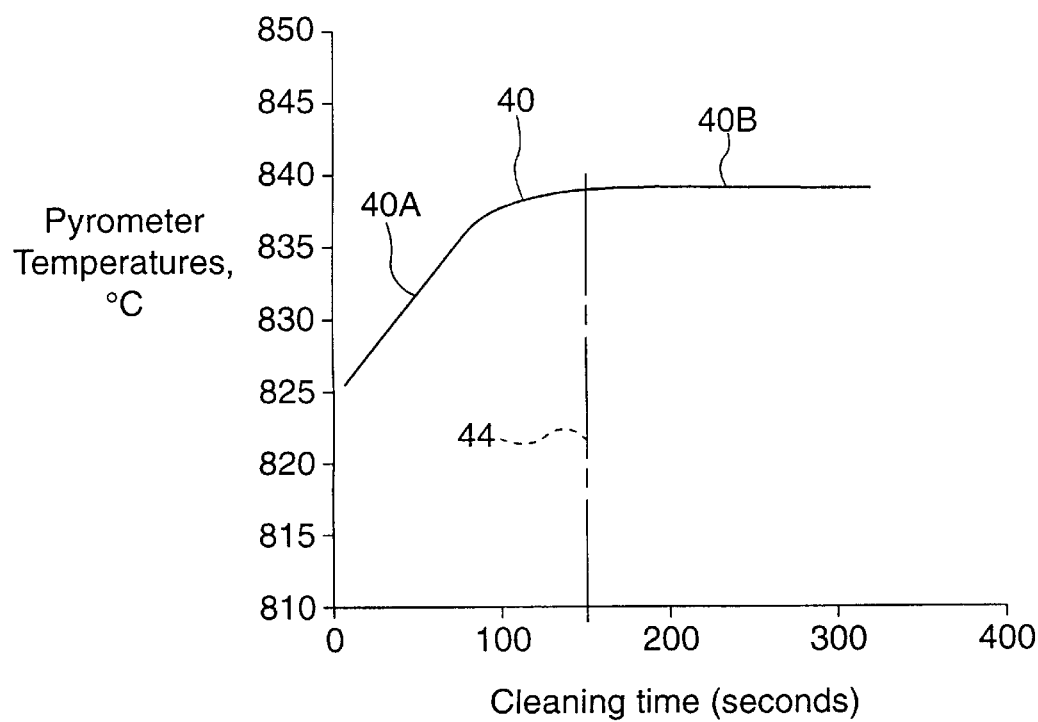
FIG. 2 is a graph illustrating temperature versus time of plasma-excited cleaning gas within a processing chamber of the apparatus of FIG. 1 as the interior of the chamber is being cleaned.

Referring now to FIG. 2, there is shown a graph of temperature measurements by the pyrometer 20 of the plasma-excited cleaning and other gases versus time within the chamber 12 with the y-axis being the pyrometer 20 temperature in degrees C. and the x-axis being the cleaning time in seconds. The curve 40 shown has an upwardly extending portion 40A, starting near time "0" (zero) and extending upward from about 825° C. temperature to a value of about 840° C. at about 150 seconds later, and a relatively flat portion 40B from 150 seconds and forward in time. This illustrates how plasma-gas temperature initially increases and then levels off at a steady-state value (level plateau). In the example given in FIG. 2, the steady-state value of temperature of about 840° C. shows that cleaning within the chamber 12 has progressed to an end point (i.e., all deposits have been removed from inside the chamber 12). This is indicated here by a dashed vertical line 44, occurring about 150 seconds after cleaning began. At such end point the cleaning process is automatically terminated by the computer 22 as was explained above. A horizontal line 46 (at about 840° C.) extending from beyond the right of the end point 44 illustrates that even if cleaning had not been stopped at the end point 44 no further cleaning would have taken place, and hence would not be useful beyond about 150 seconds in this example.

It is to be noted that the times and temperatures occurring during the cleaning process can differ from those shown in FIG. 2 depending on the composition of the cleaning gas or gases employed, the pressure within the chamber 12, the kind and amount of the solid residues being cleaned away, etc. It is also to be noted that the temperature of a wafer during processing may be only about 300° C. to 500° C., whereas the plasma-excited gas temperatures are much higher. The optical pyrometer 20 is capable of accurately reading temperatures over a range of about 200° C. to 900° C. and can be designed to cover any range depending on the power used in the plasma. By way of example, the pyrometer 20 is a Model 2000 Optical Fiber Thermometer, made by Sekidenko. This model 2000 has three 1020 nm (nanometer) channels and one 905 nm calibration channel. The optical fiber cable 18 is part No. 0620-01755.

The above description is intended in illustration and not in limitation of the invention. Various minor changes in the embodiment illustrated may occur to those skilled in the art and can be made without departing from the spirit or scope of the invention as set forth in the accompanying claims.

What is claimed is:

1. Apparatus comprising:
    a semiconductor processing chamber having electrodes that produce a plasma in the chamber from fluorine-containing cleaning gases introduced into the chamber;
    an optical temperature sensor located within the chamber;
    a controller having an input coupled to an output of the optical temperature sensor, the controller being adapted to control a flow of the cleaning gases into the chamber such that during a cleaning operation of the chamber when the optical temperature sensor indicates that the plasma has reached a steady state temperature, the computer stops the flow of the cleaning gas.

2. Apparatus for processing semiconductor substrates comprising:
    a plasma processing chamber;
    a substrate support member within the chamber having a surface capable of supporting a substrate during processing;
    a fiber optic cable having a first end positioned near the surface of the substrate support member;
    an optical pyrometer connected to a second end of the fiber optic cable for measuring the temperature of a substrate during processing, and after removal of the substrate from the chamber measuring in situ the temperature of a plasma-excited cleaning gas in the chamber during subsequent removal of unwanted solid deposits from the chamber; and
    a computer coupled to the pyrometer for determining when the temperature of the plasma-excited gas reaches a steady state value indicative of a cleaning end point, and for thereupon stopping the flow of the cleaning gas.

3. The apparatus of claim 2 wherein:
    the substrate support member is a chuck; and
    a portion of the fiber optic cable is flush with the surface of the chuck and the first end of the cable is flush with the surface of the chuck, the first end being covered by the substrate during substrate processing.

4. The apparatus of claim 2 further comprising:
    a gas supply to supply processing and cleaning gases to the chamber, the gas supply being controlled by the computer;
    electrodes for producing a plasma discharge of the cleaning gas in the chamber, the power to the electrodes being controlled by the computer; and
    an exhaust for exhausting out of the chamber the cleaning gas mixed with gassified portions of the solid deposits being cleaned out of the chamber, the exhaust being controlled by the computer.

5. The apparatus of claim 2 wherein the chamber includes electrodes for producing a plasma discharge from the processing and cleaning gases and wherein the power to the electrodes is controlled by the computer.

6. The apparatus of claim 2 wherein said chamber includes an exhaust for removing cleaning gases and the products of reaction of the solid deposits and the cleaning gases from the chamber wherein the flow of gases from the exhaust is controlled by the computer.

7. Apparatus for a chemical vapor deposition (CVD) of materials onto semiconductor substrates, the apparatus comprising:
    a processing chamber;
    a chuck within the chamber and having a surface for supporting a substrate during CVD processing;
    a fiber optic cable having a first end positioned at the surface of the chuck;
    an optical pyrometer connected to a second end of the fiber optic cable for measuring the temperature of a substrate during processing and for thereafter measuring in situ the temperature of a plasma-excited cleaning gas in the chamber during subsequent cleaning of unwanted solid deposits within the chamber after removal of the processed substrate;
    a gas supply for admitting processing and cleaning gases sequentially into the chamber;
    a pair of electrodes in the chamber for generating a plasma-discharge in the processing gas and in the cleaning gas;
    a gas outlet for maintaining a desired pressure in the chamber and exhausting processing gases, cleaning gases and other gases and the reaction products of the cleaning gases and solid deposits formed in the chamber during processing; and
    a computer coupled to the pyrometer for determining how soon after cleaning is started the temperature of the plasma-excited gas reaches a value indicative of an end point of cleaning, the computer monitoring the gas supply, the power to the electrodes, the pressure and the temperature of the cleaning gases in the chamber and to shut off the cleaning gases when a steady state temperature is reached.

8. The apparatus of claim 7 wherein the pyrometer can accurately measure temperatures within the range of from about 200° C. to about 900° C.

* * * * *